(12) United States Patent
Tomiyama

(10) Patent No.: US 6,215,829 B1
(45) Date of Patent: Apr. 10, 2001

(54) APPARATUS FOR SELECTIVELY RECEIVING CARRIER WAVE SIGNALS

(75) Inventor: Hitoshi Tomiyama, Kanagawa (JP)

(73) Assignee: Sony Corporaton, Tokyo (JP)

( * ) Notice: Subject to any disclaimer, the term of this patent is extended or adjusted under 35 U.S.C. 154(b) by 0 days.

(21) Appl. No.: 09/087,452

(22) Filed: May 29, 1998

(30) Foreign Application Priority Data

Jun. 1, 1997 (JP) .................................................. 9-157532

(51) Int. Cl.[7] ....................................................... H03K 9/00
(52) U.S. Cl. .............................................................. 375/316
(58) Field of Search .................................... 375/316, 346; 455/255, 254, 196.1, 266, 296, 302; 348/731, 733

(56) References Cited

U.S. PATENT DOCUMENTS

| | | | |
|---|---|---|---|
| 4,356,568 | * 10/1982 | Ogita et al. | 455/212 |
| 4,581,643 | * 4/1986 | Carlson | 348/731 |
| 4,709,406 | * 11/1987 | Omoto | 455/208 |
| 5,058,204 | * 10/1991 | Tahernia et al. | 455/183.1 |
| 6,018,543 | * 1/2000 | Blois et al. | 375/133 |
| 6,029,055 | * 2/2000 | Nobusawa | 455/259 |

* cited by examiner

Primary Examiner—Chi Pham
Assistant Examiner—Kevin M. Burd
(74) Attorney, Agent, or Firm—Jay H. Maioli

(57) ABSTRACT

An apparatus for receiving carrier wave signals includes a frequency converting portion operative to produce an intermediate frequency signal having a carrier frequency of an intermediate frequency, a frequency demodulator for frequency-demodulating the intermediate frequency signal with a demodulation characteristic having a center frequency substantially equal to the intermediate frequency. The apparatus uses, a DC level detector to produce a first level detection output signal having a predetermined level when a DC level of a demodulation output signal obtained from the frequency demodulator is not less than a predetermined level, and an intermediate frequency level detector operative to produce a second level detection output signal having a predetermined level when a frequency component of the intermediate frequency signal, which falls within a predetermined frequency range that includes the center frequency of the demodulation characteristic in the frequency demodulating portion, has a level not less than a predetermined level. A signal discriminating portion is used for discriminating between a desirable condition in which the input signal is a carrier wave signal desired, to be received and an undesirable condition in which the input signal based is an image frequency signal on the strength of the first and second level detection output signals under a condition in which the receiving frequency is successively changed.

6 Claims, 2 Drawing Sheets

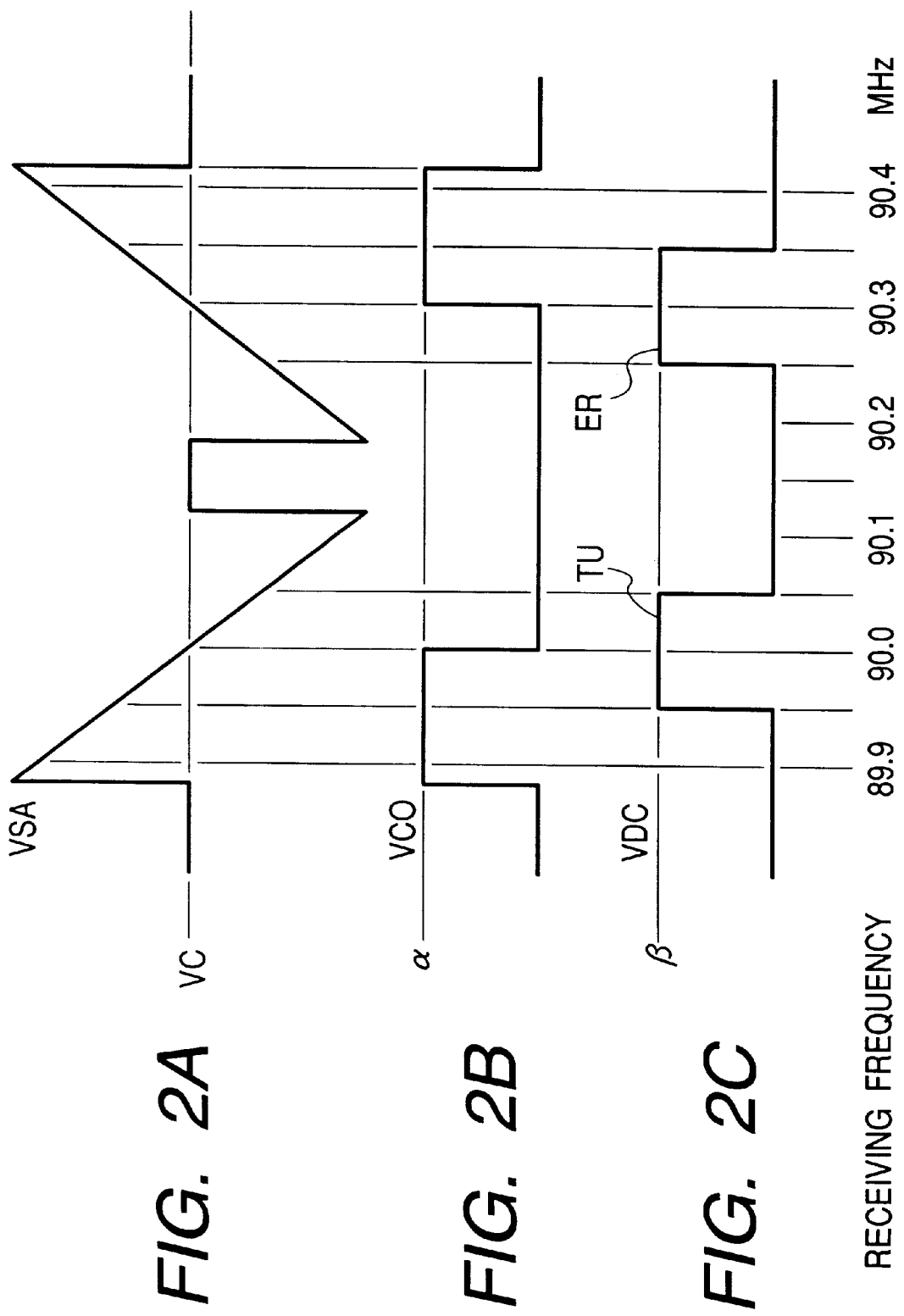

APPARATUS FOR SELECTIVELY RECEIVING CARRIER WAVE SIGNALS

BACKGROUND OF THE INVENTION

1. Field of the Invention

The present invention relates to an apparatus for selectively receiving carrier wave signals, and more particularly, is directed to an improvement in a carrier wave signal receiving apparatus for selectively receiving frequency-modulated (FM) carrier wave signals, such as FM radio broadcasting signals, and obtaining a demodulated output signal based on the FM carrier wave signal received thereby.

2. Description of the Prior Art

In the field of super heterodyne receivers used for receiving FM carrier wave signals, such as FM radio broadcasting signals, there has been generalized employ a digital tuning system wherein, for example, a phase-locked loop (PLL) is utilized in place of an analog tuning system wherein a variable capacitor is used. In the super heterodyne receiver in which the digital tuning system is employed, the phase-locked loop is operative to set exactly various receiving frequencies, for example, under the control by a microcomputer, and manual adjustments to the receiving frequency by a user are not necessary.

In the super heterodyne receiver employing the digital tuning system, an automatic scanning tuning operation is performed. Under a condition in which the automatic scanning tuning operation is carried out, a receiving frequency provided for receiving selectively FM carrier wave signals is successively changed at predetermined regular frequency intervals by the PLL. Then, when there is an FM carrier wave signal which tunes with the receiving frequency, the change in the receiving frequency is temporarily ceased to keep the FM carrier wave signal tuning therewith, so that each FM carrier wave signal is searched. During the automatic scanning tuning operation in which such a signal search as mentioned above is carried out, it is desired to avoid such a situation that an image frequency signal which is not any FM carrier wave signal intended to be received acts as an FM carrier wave signal so that a malfunction by which the change in the receiving frequency is temporarily ceased is caused.

Accordingly, it has been proposed to cause an intermediate frequency signal which is obtained by frequency-converting the FM carrier wave signal to have a relatively high carrier frequency, for example, 10.7 MHz so that the image frequency signal is not located in a frequency range wherein the FM carrier wave signals expected to be selectively received exist and therefore cannot be detected in the automatic scanning tuning operation.

In addition, it is also proposed recently to form an intermediate frequency circuit portion of the super heterodyne receiver used for receiving the FM carrier wave signals, which includes an intermediate frequency filter for causing the intermediate frequency signal to pass therethrough, into an integrated circuit (IC) on the basis of the development in integrating technology related to electronic circuits. That is, in the super heterodyne receiver used for receiving the FM carrier wave signals, the intermediate frequency circuit portion is constituted by means of using one or more IC chips.

In such a case, the intermediate frequency filter contained in the IC chip is formed with resistive elements and capacitive elements which are materialized in the IC chip and therefore a passing frequency band of the intermediate frequency filter must be arranged to be located in relatively low frequency range. Therefore, in the intermediate frequency circuit portion including the intermediate frequency filter and comprising one or more IC chips, the intermediate frequency set therein is selected to be relatively low, for example, 150 kHz.

In the case where the intermediate frequency is selected to be relatively low, such as 150 kHz, in the super heterodyne receiver used for receiving the FM carrier wave signals as described above, the image frequency signal is undesirably located in the frequency range wherein the FM carrier wave signals expected to be selectively received exist. Consequently, it is feared that when a selected FM carrier wave signal is desired to tune with the receiving frequency successively changed by the PLL in the automatic scanning tuning operation, such a malfunction that an image frequency signal which results from another FM carrier wave signal adjacent to the selected FM carrier wave signal acts as the selected FM carrier wave signal to tune undesirably with the receiving frequency is brought about.

OBJECTS AND SUMMARY OF THE INVENTION

Accordingly, it is an object of the present invention to provide an apparatus for selectively receiving carrier wave signals, by which FM carrier wave signals expected to be received are selectively received in accordance with a super heterodyne system and a demodulation output signal is obtained based on the received FM carrier wave signal, and which avoids the aforementioned disadvantages encountered with the prior art.

Another object of the present invention is to provide an apparatus for selectively receiving carrier wave signals, by which FM carrier wave signals expected to be received are selectively received in accordance with a super heterodyne system and a demodulation output signal is obtained based on the received FM carrier wave signal, and which can avoid interferences brought about by image frequency signals in an automatic scanning tuning operation. This is accomplished with the use of a receiving frequency successively changed under a situation wherein an intermediate frequency which is a carrier frequency of an intermediate frequency signal obtained by frequency-converting the received FM carrier wave signal is selected to be relatively low.

A further object of the present invention is to provide an apparatus for selectively receiving carrier wave signals, by which FM carrier wave signals expected to be received are selectively received in accordance with a super heterodyne system and a demodulation output signal is obtained based on the received FM carrier wave signal, and which can avoid interferences brought about by image frequency signals in an automatic scanning tuning operation. The apparatus uses a receiving frequency successively changed under a situation wherein an intermediate frequency circuit portion of the apparatus, which includes an intermediate frequency filter for causing an intermediate frequency signal obtained by frequency-converting the received FM carrier wave signal to pass therethrough, with said filter formed on an IC operating with a relatively low carrier frequency of the intermediate frequency signal.

According to the present invention, there is provided an apparatus for receiving carrier wave signals, which comprises a frequency converting portion for frequency-converting an input signal so as to convert a carrier frequency of the input signal into a predetermined intermediate frequency with a local oscillation signal having its frequency determining variably a receiving frequency and to produce an intermediate frequency signal having its carrier frequency of the intermediate frequency, an intermediate frequency amplifying portion for amplifying the intermediate frequency signal, a frequency demodulating portion for frequency-demodulating the intermediate frequency signal obtained from the intermediate frequency amplifying portion with a demodulation characteristic having a center frequency substantially equal to the intermediate frequency. In addition, a direct current (DC) level detecting portion is used to produce a first level detection output signal which has a predetermined level when a DC level of a demodulation output signal obtained from the frequency demodulating portion is equal to or more than a predetermined level. An intermediate frequency level detecting portion produces a second level detection output signal which has a predetermined level when a frequency component of the intermediate frequency signal obtained from the intermediate frequency amplifying portion is within a predetermined frequency range including the center frequency of the demodulation characteristic in the frequency demodulating portion and, has its level equal to or more than a predetermined level. A signal discriminating portion for discriminating between a desirable condition in which the input signal is a carrier wave signal desired to be received and an undesirable condition in which the input signal is an image frequency signal on the strength of the first level detection output signal obtained from the DC level detecting portion and the second level detection output signal obtained from the intermediate frequency level detecting portion under a situation wherein the receiving frequency is successively changed.

In an embodiment of apparatus for receiving carrier wave signals thus constituted according to the present invention, a discrimination result obtained in the signal discriminating portion is used for controlling the frequency of the local oscillation signal which determines variably the receiving frequency.

In the apparatus for receiving carrier wave signals constituted as mentioned above according to the present invention, when an automatic scanning tuning operation is performed to change successively the receiving frequency under a situation wherein the intermediate frequency is predetermined to be relatively low so that the image frequency signal comes into a frequency range in which carrier wave signals expected to be received exist, the first detection output signal obtained from the DC level detecting portion has a different level during a condition whererin a receiving frequency which is set immediately before another receiving frequency with which the second level detection output signal obtained from the intermediate frequency level detecting portion has the predetermined level, when the input signal is the carrier wave signal desired to be received. This level is different from that of the demodulation output signal based on the input signal is obtained from the frequency demodulating portion and in a situation wherein the input signal is the image frequency signal and the demodulation output signal based on the image frequency signal is obtained from the frequency demodulating portion.

For example, in the desirable condition in which the input signal is the carrier wave signal desired to be received and the demodulation output signal based on the input signal is obtained from the frequency demodulating portion, the first detection output signal obtained from the DC level detecting portion during the condition whererin the receiving frequency which is set immediately before another receiving frequency with which the second level detection output signal obtained from the intermediate frequency level detecting portion has the predetermined level, has a predetermined level. In the undesirable condition in which the input signal is the image frequency signal and the demodulation output signal based on the image frequency signal is obtained from the frequency demodulating portion, the first detection output signal obtained from the DC level detecting portion during the condition whererin the receiving frequency which is set immediately before another receiving frequency with which the second level detection output signal obtained from the intermediate frequency level detecting portion has the predetermined level, does not have the predetermined level.

Accordingly, the signal discriminating portion is operative to discriminate between the desirable condition in which the input signal is the carrier wave signal desired to be received and the undesirable condition in which the input signal is the image frequency signal on the strength of such a relation as described above between the level of the first detection output signal obtained from the DC level detecting portion and the level of the second detection output signal obtained from the intermediate frequency level detecting portion when the automatic scanning tuning operation is performed to change successively the receiving frequency.

As a result, for example, in the case where the frequency of the local oscillation signal which determines variably the receiving frequency is controlled by use of the discrimination result obtained in the signal discriminating portion, the change in the receiving frequency is temporarily ceased to keep the carrier wave signal desired to be received tuning therewith when the input signal is the carrier wave signal desired to be received. The change in the receiving frequency continues without being temporarily ceased when the input signal is the image frequency signal, so that interferences brought about by the image frequency signal are eliminated from the automatic scanning tuning operation.

The above, and other objects, features and advantages of the present invention will become apparent from the following detailed description taken in conjunction with the accompanying drawings.

BRIEF DESCRIPTION OF THE DRAWINGS

FIG. 2A, FIG. 2B, and FIG. 2C are level-frequency characteristic charts used for explaining the operation of the embodiment shown in FIG. 1.

DESCRIPTION OF THE PREFERRED EMBODIMENT

Figure 1:
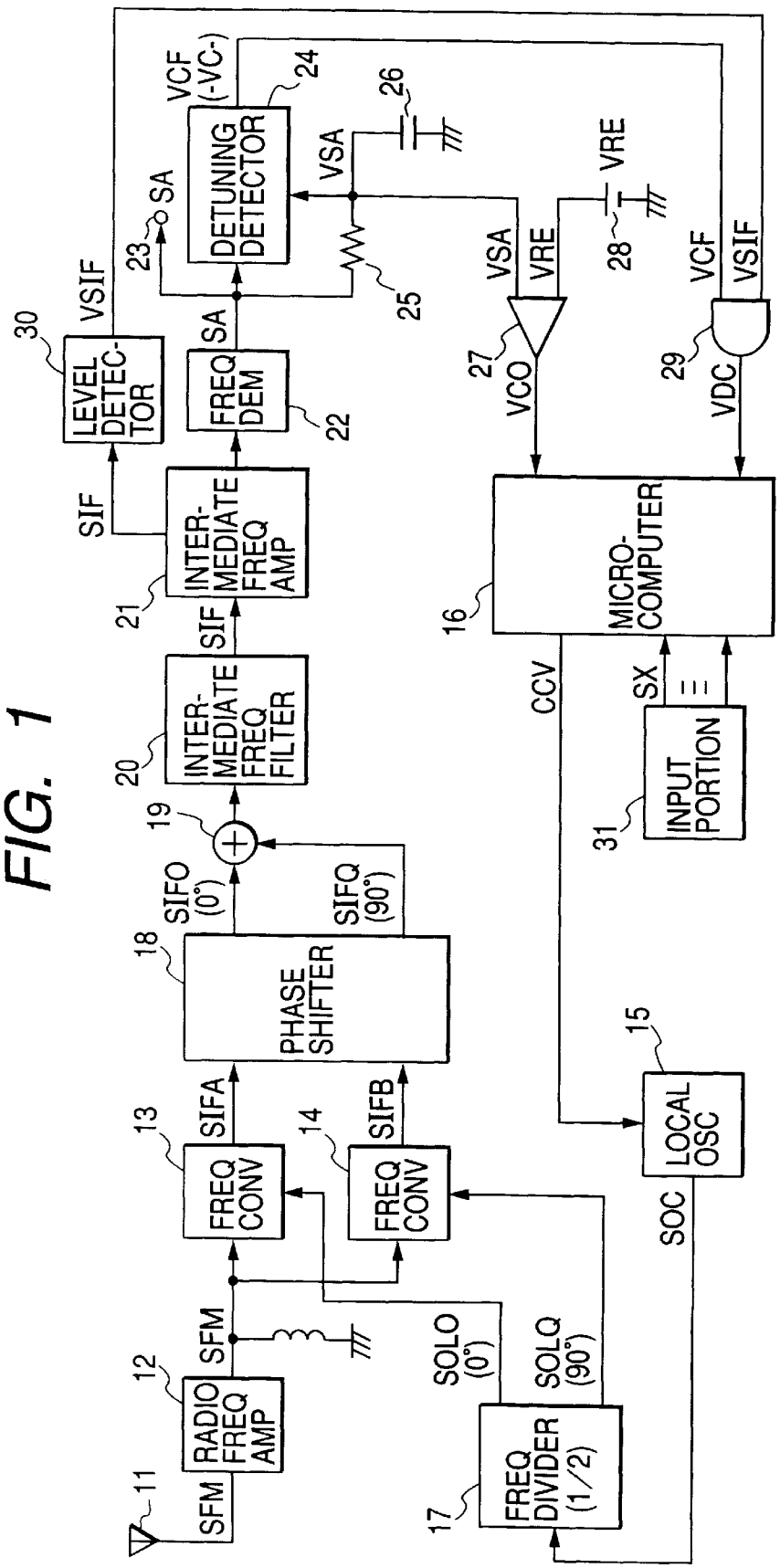
FIG. 1 is a block diagram showing an embodiment of apparatus for receiving carrier wave signals according to the present invention.

FIG. 1 shows an embodiment of apparatus for receiving carrier wave signals according to the present invention. This embodiment is operative to receive an FM radio broadcasting signal as an FM carrier wave signal.

Referring to FIG. 1, an input signal which includes an FM carrier wave signal SFM and comes through an antenna 11 is amplified by a radio frequency amplifier 12 and then supplied to frequency convertors 13 and 14. The FM carrier wave signal SFM is an FM radio broadcasting signal having its carrier frequency which in contained in a frequency range of, for example, 76 to 108 MHz.

In the embodiment shown in FIG. 1, a local oscillator 15 and a microcomputer 16 are provided. The local oscillator 15 is operative to produce an oscillation output signal SOC having a frequency of double as high as a frequency which is lower by a predetermined value, for example, 150 kHz than a receiving frequency. The frequency of the oscillation output signal SOC is controlled by a control signal CCV supplied from the microcomputer 16. That is, in the embodiment shown in FIG. 1, under a condition in which the frequency of the oscillation output signal SOC is controlled by the control signal CCV supplied from the microcomputer 16, the receiving frequency is variably determined to be a frequency which is higher by 150 kHz than a half of the frequency of the oscillation output signal SOC obtained from the local oscillator 15.

The oscillation output signal SOC obtained from the local oscillator 15 is supplied to a frequency divider 17 and subjected to a frequency dividing processing to be divided into halves (½) in frequency in the frequency divider 17. As a result of such a frequency dividing processing, a couple of local oscillation signals SOLO and SOLQ are obtained from the frequency divider 17. Each of the local oscillation signals SOLO and SOLQ has a frequency corresponding to a half of the frequency of the oscillation output signal SOC obtained from the local oscillator 15 and a mutual phase difference by 90 degrees between each other. The local oscillation signal SOLO is supplied to the frequency convertor 13 and the local oscillation signal SOLQ is supplied to the frequency convertor 14. This means that each of the local oscillation signals SOLO and SOLQ obtained from the frequency divider 17 is operative to determine with its frequency variably the receiving frequency in the embodiment shown in FIG. 1 to be a frequency higher by 150 kHz than the frequency of the local oscillation signal SOLO or SOLQ.

An intermediate frequency signal SIFA which is obtained by frequency-converting the input signal supplied through the radio frequency amplifier 12 with the local oscillation signal SOLO is derived from the frequency convertor 13. Similarly, an intermediate frequency signal SIFB which is obtained by frequency-conversion to the input signal supplied through the radio frequency amplifier 12 with the local oscillation signal SOLQ is derived from the frequency convertor 14. Each of the intermediate frequency signals SIFA and SIFB thus obtained has its carrier frequency corresponding to a difference between the frequency of the local oscillation signal SOLO or SOLQ and the receiving frequency, namely, an intermediate frequency of 150 kHz.

The intermediate frequency signal SIFA derived from the frequency convertor 13 and the intermediate frequency signal SIFB derived from the frequency convertor 14 are supplied to a phase shifter 18 which comprises biquadratic phase shifting circuits. A couple of intermediate frequency signals SIFO and SIFQ based on the intermediate frequency signals SIFA and SIFB, respectively, are derived from the phase shifter 18 to be supplied to a signal adder 19. Each of the intermediate frequency signals SIFO and SIFQ has its carrier frequency corresponding to the intermediate frequency determined to be 150 kHz and a mutual phase difference by 90 degrees between each other. The frequency convertors 13 and 14 constitute an image frequency signal suppresser by which an image frequency signal is suppressed at level by, for example, about 40 dB.

An intermediate frequency signal SIF which is obtained by adding the intermediate frequency signals SIFO and SIFQ to each other and has its carrier frequency corresponding to the intermediate frequency determined to be 150 kHz is derived through an intermediate frequency filter 20 from the signal adder 19. Accordingly, the frequency convertors 13 and 14, the local oscillator 15, the frequency divider 17, the phase shifter 18 and the signal adder 19 in the aggregate constitute a frequency converting portion for frequency-converting the input signal, which includes the FM carrier wave signal SFM and is supplied through the radio frequency amplifier 12, into the intermediate frequency signal SIF having the carrier frequency corresponding to the intermediate frequency determined to be 150 kHz. The intermediate frequency signal SIF obtained through the intermediate frequency filter 20 is supplied to an intermediate frequency amplifier 21 to be amplified with a predetermined gain therein.

The intermediate frequency signal SIF amplified in the intermediate frequency amplifier 21 is supplied to a frequency demodulator 22. The frequency demodulator 22 is provided with a frequency-demodulation characteristic having a center frequency equal to the intermediate frequency determined to be 150 kHz. A frequency-demodulation output signal SA which is obtained by frequency-demodulation to the intermediate frequency signal SIF is derived from the frequency demodulator 22.

The frequency-demodulation output signal SA obtained from the frequency demodulator 22 is led to a terminal 23 and supplied to a detuning detector 24. Further, the frequency-demodulation output signal SA obtained from the frequency demodulator 22 is supplied to a series connection of a resistive element 25 and a capacitive element 26 connected between an output end of the frequency demodulator 22 and a reference potential point. A DC voltage VSA based on the frequency-demodulation output signal SA is obtained between the reference potential point and a connecting point between the resistive element 25 and the capacitive element 26 (across the capacitive element 26).

The DC voltage VSA obtained across the capacitive element 26 based on the frequency-demodulation output signal SA is supplied to a comparison input terminal a level comparator 27. A reference DC voltage VRE which corresponds to a central level VC of the DC voltage VSA obtained across the capacitive element 26 is supplied from a voltage source 28 to a reference input terminal of the level comparator 27. A first level detection output signal VCO is obtained from the level comparator 27 as a result of level comparison of the DC voltage VSA to the reference DC voltage VRE in the level comparator 27. The first level detection output signal VCO has a predetermined level when the DC voltage VSA is equal to or higher than the reference DC voltage VRE, in other words, when the DC voltage level of the frequency-demodulation output signal SA obtained from the frequency demodulator 22 is equal to or higher than the central level VC of the DC voltage VSA which is a DC voltage level of the frequency-demodulation output signal SA obtained by frequency-demodulation to a frequency component of the intermediate frequency signal SIF which corresponds to the center frequency of the frequency-demodulation characteristic in the frequency demodulator 22. Accordingly, the level comparator 27 constitutes a DC level detector for producing the first level detection output signal VCO having the predetermined level when the DC voltage level of the frequency-demodulation output signal SA obtained from the frequency demodulator 22 is equal to or higher than the predetermined level. The first level detection output signal VCO obtained from the level comparator 27 is supplied to the microcomputer 16.

The DC voltage VSA obtained across the capacitive element 26 based on the frequency-demodulation output signal SA is supplied also to the detuning detector 24. A detection output signal VCF which has a predetermined high level when the frequency-demodulation output signal SA obtained based on frequency components of the intermediate frequency signal SIF which belong to a predetermined frequency range with a center frequency corresponding to the intermediate frequency determined to be 150 kHz, for example, a frequency range from a frequency lower by 50 kHz than the intermediate frequency, namely, 100 kHz to a frequency higher by 50 kHz than the intermediate frequency, namely, 200 kHz, is obtained from the frequency demodulator 22, is derived from the detuning detector 24 to be supplied to one of input terminals of an AND circuit 29.

The intermediate frequency signal SIF amplified in the intermediate frequency amplifier 21 is supplied also to a level detector 30. A detection output signal VSIF which has a predetermined high level when the intermediate frequency signal SIF from the intermediate frequency amplifier 21 has its level higher than a predetermined level, is derived from the level detector 30 to be supplied to the other of input terminals of the AND circuit 29. A second level detection output signal VDC is obtained from the AND circuit 29 as a result of level check of the detection output signal VCF and the detection output signal VSIF in the AND circuit 29. The second level detection output signal VDC has a predetermined level when the detection output signal VCF from the detuning detector 24 has the predetermined high level and the detection output signal VSIF from the level detector 30 has also the predetermined high level, that is, when the frequency components of the intermediate frequency signal SIF which belong to the predetermined frequency range with the center frequency corresponding to the intermediate frequency determined to be 150 kHz, namely, the center frequency of the frequency-demodulation characteristic in the frequency demodulator 22, for example, the frequency range from the frequency lower by 50 kHz than the intermediate frequency, namely, 100 kHz to the frequency higher by 50 kHz than the intermediate frequency, namely, 200 kHz, have their levels equal to or higher than the predetermined level. Accordingly, the AND circuit 29 constitutes an intermediate frequency level detector for producing the second level detection output signal VDC having the predetermined level when the frequency components of the intermediate frequency signal SIF which belong to the predetermined frequency range with the center frequency corresponding to the center frequency of the frequency-demodulation characteristic in the frequency demodulator 22 have their levels equal to or higher than the predetermined level. The second level detection output signal VDC obtained from the AND circuit 29 is also supplied to the microcomputer 16.

In the microcomputer 16, for example, when an input portion 31 is operated to supply the microcomputer 16 with a command signal SX which orders the microcomputer 16 to perform operations for the automatic scanning tuning operation, the control signal CCV is produced to be supplied to the local oscillator 15 and it is checked on the strength of the first and second level detection output signals VCO and VDC whether the input signal supplied from the radio frequency amplifier 12 to the frequency converters 13 and 14 is the FM carrier wave signal SFM desired to be received or the image frequency signal. The control signal CCV is supplied to the local oscillator 15 for causing the receiving frequency in the embodiment shown in FIG. 1 to change successively at predetermined regular frequency intervals, for example, 100 kHz.

The local oscillator 15 to which the control signal CCV is supplied is operative to change the frequency of the oscillation output signal SOC successively in response to the control signal CCV so that the frequency of each of the local oscillation signals SOLO and SOLQ obtained from the frequency divider 17 is increased successively at predetermined regular frequency intervals, for example, 100 kHz. With such changes in frequency of the local oscillation signals SOLO and SOLQ, the receiving frequency in the embodiment shown in FIG. 1, which is higher by 150 kHz than the frequency of each of the local oscillation signals SOLO and SOLQ is also increased successively at predetermined regular frequency intervals, for example, 100 kHz, from a predetermined lowest frequency, for example, 75 kHz and thereby the automatic scanning tuning operation is carried out.

Supposing that the input signal supplied through the radio frequency amplifier 12 to the frequency converters 13 and 14 is the FM carrier wave signal SFM having its carrier frequency of 90 MHz, when the frequency of each of the local oscillation signals SOLO and SOLQ is set to be 89.85 MHz so that the receiving frequency is set to be 90 MHz, the intermediate frequency signal SIF having its carrier frequency equal to the intermediate frequency determined to be 150 kHz which is produced based on the FM carrier wave signal SFM having its carrier frequency of 90 MHz and the local oscillation signals SOLO and SOLQ each having its frequency of 89.85 MHz is obtained from the intermediate frequency amplifier 21. Then, when the frequency of each of the local oscillation signals SOLO and SOLQ is set to be 90.15 MHz so that the receiving frequency is set to be 90.3 MHz, the intermediate frequency signal SIF having its carrier frequency equal to the intermediate frequency determined to be 150 kHz which is produced based on the FM carrier wave signal SFM having its carrier frequency of 90 MHz and the local oscillation signals SOLO and SOLQ each having its frequency of 90.15 MHz is obtained from the intermediate frequency amplifier 21.

The intermediate frequency signal SIF thus obtained from the intermediate frequency amplifier 21 when the frequency of each of the local oscillation signals SOLO and SOLQ is set to be 90.15 MHz so that the receiving frequency is set to be 90.3 MHz, which appears in spite of the absence of the FM carrier wave signal SFM having its carrier frequency of 90.3 MHz, is produced based on an image frequency signal resulting from the existence of the FM carrier wave signal SFM having its carrier frequency of 90 MHz.

When the automatic scanning tuning operation is carried out with the receiving frequency which is successively increased at predetermined regular frequency intervals, for example, 100 kHz, from the predetermined lowest frequency, for example, 75 kHz, the DC voltage VSA, which is obtained across the capacitive element 26 based on the frequency-demodulation output signal SA to have the central level VC corresponding to the reference DC voltage VRE, varies at level in such a manner as shown in FIG. 2A in response to the successive increases in the receiving frequency at regular frequency intervals of 100 kHz. Therefore, as shown in FIG. 2B, the first level detection output signal VCO obtained from the level comparator 27 has the predetermined level ($\alpha$) only when the level of the DC voltage VSA is equal to or higher than the central level VC. Further, as shown in FIG. 2C, the second level detection output signal VDC obtained from the AND circuit 29 has the predetermined level($\beta$) based on the intermediate frequency signal SIF obtained from the intermediate frequency amplifier 21 in response to the FM carrier wave signal SFM having its carrier frequency of 90 MHz when the receiving frequency is set to be 90 MHz and also has the predetermined level ($\beta$) based on the intermediate frequency signal SIF obtained from the intermediate frequency amplifier 21 in response to the image frequency signal having equivalently its carrier frequency of 90.3 MHz when the receiving frequency is set to be 90.3 MHz.

Under such a situation, in the microcomputer 16, a part of the second level detection output signal VDC obtained from the AND circuit 29, which has the predetermined level β and is obtained based on the FM carrier wave signal SFM having its carrier frequency of 90 MHz when the receiving frequency is set to be 90 MHz (this part will be referred to as a part TU), and a part of the second level detection output signal VDC obtained from the AND circuit 29, which has the predetermined level β and is obtained based on an image frequency signal having equivalently its carrier frequency of 90.3 MHz when the receiving frequency is set to be 90.3 MHz (this part will be referred to as a part ER), are distinguished from each other and thereby the input signal supplied through the radio frequency amplifier 12 to the frequency convertors 13 and 14 is discriminated between the FM carrier wave signal SFM desired to be received and the image frequency signal.

The discrimination on the input signal between the FM carrier wave signal SFM desired to be received and the image frequency signal is carried out based on such circumstances that, under a situation wherein the part TU of the second level detection output signal VDC is obtained with the receiving frequency set to be 90 MHz, the first level detection output signal VCO obtained from the level comparator 27 has the predetermined level α when the receiving frequency is set to be 98.9 MHz which is immediately before 90 MHz, as shown in FIG. 2B, and, under a situation wherein the part ER of the second level detection output signal VDC is obtained with the receiving frequency set to be 90.3 MHz, the first level detection output signal VCO obtained from the level comparator 27 does not have the predetermined level α when the receiving frequency is set to be 90.2 MHz which is immediately before 90.3 MHz, as shown in FIG. 2B.

As a result of the discrimination mentioned above, it is recognized that the input signal supplied through the radio frequency amplifier 12 to the frequency convertors 13 and 14 is the FM carrier wave signal SFM desired to be received when the part TU of the second level detection output signal VDC is detected in the microcomputer 16 and it is also recognized that the input signal supplied through the radio frequency amplifier 12 to the frequency convertors 13 and 14 is the image frequency signal when the part ER of the second level detection output signal VDC is detected in the microcomputer 16.

As described above, the microcomputer 16 constitutes a signal discriminating portion for discriminating between a desirable condition in which the input signal supplied through the radio frequency amplifier 12 to the frequency convertors 13 and 14 is the FM carrier wave signal SFM desired to be received and an undesirable condition wherein the input signal supplied through the radio frequency amplifier 12 to the frequency convertors 13 and 14 is the image frequency signal on the strength of the first level detection output signal VCO obtained from the level comparator 27 and the second level detection output signal VDC obtained from the AND circuit 29 under a situation wherein the automatic scanning tuning operation is carried out with the receiving frequency which is successively increased at predetermined regular frequency intervals, for example, 100 kHz.

Then, the microcomputer 16 is operative to cause the control signal CCV supplied to the local oscillator 15 to cease the change in the frequency of the oscillation output signal SOC when it is recognized that the input signal supplied through the radio frequency amplifier 12 to the frequency convertors 13 and 14 is the FM carrier wave signal SFM desired to be received, and to cause also the control signal CCV supplied to the local oscillator 15 to maintain the change in the frequency of the oscillation output signal SOC when it is recognized that the input signal supplied through the radio frequency amplifier 12 to the frequency convertors 13 and 14 is the image frequency signal. Accordingly, when the input signal supplied through the radio frequency amplifier 12 to the frequency convertors 13 and 14 is the FM carrier wave signal SFM desired to be received, the receiving frequency on that occasion is kept without being changed so that the FM carrier wave signal SFM is continuously received. While, when the input signal supplied through the radio frequency amplifier 12 to the frequency convertors 13 and 14 is the image frequency signal, the receiving frequency is maintained to be successively changed so that the image frequency signal cannot be received and thereby interferences brought about by the image frequency signal are eliminated from the automatic scanning tuning operation.

What is claimed is:

1. An apparatus for receiving carrier wave signals, comprising:

a frequency converting portion for frequency-converting an input signal so as to convert a carrier frequency of the input signal into an intermediate frequency signal having a predetermined intermediate frequency using a local oscillation signal whose frequency determines a receiving frequency and varies at a predetermined frequency interval;

an intermediate frequency amplifying portion for amplifying the intermediate frequency signal;

a frequency demodulating portion for frequency-demodulating the intermediate frequency signal obtained from the intermediate frequency amplifying portion with a demodulation characteristic having a center frequency substantially equal to the intermediate frequency;

a DC level detecting portion for producing a first level detection output signal which has a predetermined level when a DC level of a demodulation output signal obtained from the frequency demodulating portion is not less than a predetermined level corresponding to the center frequency of the demodulation characteristic;

an intermediate frequency level detecting portion for producing a second level detection output signal which has a predetermined level when a frequency component of the intermediate frequency signal obtained from the intermediate frequency amplifying portion has a level not less than a predetermined level, and when the frequency component belongs to a predetermined frequency range that includes the center frequency of the demodulation characteristic of said frequency demodulating portion; and a signal discriminating portion for discriminating between a desirable condition in which the input signal is a carrier wave signal desired to be received and an undesirable condition in which the input signal is an image frequency signal based on a strength of the first level detection output signal obtained from the DC level detecting portion and a strength of the second level detection output signal obtained from the intermediate frequency level detecting portion, wherein the receiving frequency is successively changed until both the first level detection output signal and the second level detection output signal are at the respective predetermined levels.

2. An apparatus for receiving carrier wave signals according to claim 1, wherein the DC level detecting portion produces the first level detection output signal having the predetermined level when the DC level of the demodulation output signal obtained from the frequency demodulating portion is not less than a DC level of the demodulating output signal obtained based on the frequency component of the intermediate frequency signal corresponding to the center frequency of the demodulation characteristic of the frequency demodulating portion.

3. An apparatus for receiving carrier wave signals according to claim 1, wherein the signal discriminating portion discriminates between the desirable condition in which the input signal is the carrier wave signal desired to be received and the undesirable condition in which the input signal is the image frequency signal based on the strength of the first level detection output signal when the receiving frequency is set to be a frequency immediately before a frequency of the second level detection output signal obtained from the intermediate frequency level detecting portion is the predetermined level.

4. An apparatus for receiving carrier wave signals according to claim 1, wherein a determination result obtained from the signal discriminating portion is used to control the frequency of the local oscillation signal.

5. An apparatus for receiving carrier wave signals according to claim 1, wherein the signal discriminating portion comprises a microcomputer to which the first level detection output signal obtained from the DC level detecting portion and the second level detection output signal obtained from the intermediate frequency level detecting portion are supplied.

6. The apparatus for receiving carrier wave signals according to claim 1, wherein said intermediate level detector means comprises:

a level detector for producing an output signal of a predetermined level when a frequency component of the intermediate frequency signal obtained from the intermediate frequency amplifying portion has a level not less than a predetermined level; and an AND circuit for producing the second level detection output signal of a predetermined level when the output signal from the level detector is of the predetermined level and when the frequency component of the intermediate frequency signal obtained from the intermediate frequency amplifying portion belongs to a predetermined frequency range that includes the center frequency of the demodulation characteristic of the frequency demodulation portion.

\* \* \* \* \*